United States Patent
Yoshitome

(10) Patent No.: US 6,242,914 B1
(45) Date of Patent: *Jun. 5, 2001

(54) MAGNETIC RESONANCE IMAGING METHOD AND MAGNETIC RESONANCE IMAGING SYSTEM

(75) Inventor: Eiji Yoshitome, Wako (JP)

(73) Assignee: The Institute of Physical and Chemical Research, Wako (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,110

(22) Filed: Apr. 8, 1999

(30) Foreign Application Priority Data

Apr. 8, 1998 (JP) .................................................. 10-095839

(51) Int. Cl.$^7$ ....................................................... G01V 3/00
(52) U.S. Cl. ........................... 324/309; 324/306; 324/312; 324/318; 600/410
(58) Field of Search .................................. 324/309, 307, 324/318, 306; 600/410

(56) References Cited

U.S. PATENT DOCUMENTS

| | | | |
|---|---|---|---|
| 4,851,779 | * | 7/1989 | DeMeester et al. ................... 324/312 |
| 5,652,513 | * | 7/1997 | Liu et al. ............................... 324/306 |

OTHER PUBLICATIONS

MAGNETIC RESONANCE IN MEDICINE, Vol. 13, Feinberg et al, "Echo–Planar Imaging with Asymmetric. . .", pp. 162–169, 1990.

PROC. OF ISMRM 4$^{th}$ Meeting, N.Y., Kao et al, "Nyquist Ghost Elimination in Blipped. . .", pp.1476, 1996.

* cited by examiner

Primary Examiner—Christine K. Oda
Assistant Examiner—Brij B. Shrivastav
(74) Attorney, Agent, or Firm—Jacobson, Price, Holman & Stern, PLLC

(57) ABSTRACT

A method and a system for magnetic resonance imaging using echo planar method enable obtaining MRI images reduced in ghost artifacts. The magnetic resonance imaging system realizing the magnetic resonance imaging method includes a gradient coil for fast switching (inverting) a gradient magnetic field in a magnetostatic field applied to an object to be analyzed by a magnetostatic field generator, a receiver for receiving magnetic resonant signals from atomic nuclei of the object to be analyzed as echo signals necessary for filling a k-space, k-space data developer for developing the signals converted into a digital form over the a k-space as echo data, data collector for collecting echo data of the same phase encoding data in two frequency encoding directions for about half the k-space, and imager for making an image by classifying the echo data by frequency encoding direction, performing Fourier transformation separately to obtain images, and adding absolute number processed images to improve S/N.

8 Claims, 5 Drawing Sheets

MAGNETIC RESONANCE IMAGING METHOD AND MAGNETIC RESONANCE IMAGING SYSTEM

BACKGROUND OF THE INVENTION

1. Field of the Invention

This invention relates to a magnetic resonance imaging method and a magnetic resonance imaging system.

2. Background Art

Magnetic resonance imaging (MRI) is a method for imaging echo signals generated from atomic nuclei such as protons in magnetic resonance by collecting positionally encoded echo signals using gradient magnetic field and by decoding using Fourier transform.

In general, it takes much time for imaging by MRI, and various proposals have been presented for reducing the imaging time.

EPI (echo planar imaging) is most representative one of high-speed MRI imaging methods. EPI is a method for collecting echo signals necessary for filling a k space as a multi-echo by switching (inverting) a gradient magnetic field very quickly in a uniform magnetostatic field generated by excitation by RF pulses.

EPI uses multi-shot switching or single-shot switching for switching of a magnetic field. Multi-shot EPI collects echo data necessary for reconstructing images over a plurality of occurrences of excitation whereas single-shot EPI collects all echo data in one step of excitation.

Since single-shot EPI enables obtaining MR images in a very short time as short as 30 to 40 ms, it is also used in functional MRI (FMRI) for catching dynamic changes of viscera, especially, images of blood flows in brains or hearts, peristalses of cardiac muscular walls and digestive tracts.

However, in case of imaging by the EPI method, read-out magnetic gradients are inverted in polarity. Therefore, when using the conventional method configured to reconstruct images by simply assembling obtained echo signals, single-shot EPI images are subject to ghost images called artifacts, and invite diagnostic errors.

Especially in FMRI which takes hundreds of images successively, an eddy current generated during imaging is liable to cause changes in intensity and phase of ghost, this is added to original images and varies the signal intensity of images together with the ghosts. This was a bar to quantitative analysis in FMRI.

SUMMARY OF THE INVENTION

It is therefore an object of the invention to provide a magnetic resonance imaging method and a magnetic resonance imaging system which can reduce changes in signal intensity of images with time, reduce ghost artifacts, and obtain a good image quality with maitaining same S/N ratio per time as conventional method.

According to the invention, there is provided a magnetic resonance imaging method comprising:

a process for switching (inverting) a gradient magnetic field at a high speed in a magnetostatic field applied to an object to be analyzed and obtaining magnetic resonant signals from atomic nuclei in said object to be analyzed as echo signals necessary for filling a k-space which is constructed by two axes of frequency encoding and phase encoding;

a process for converting said resonance signals into a digital form and developing them in the k-space as echo data;

a first scan process for sequentially scanning a phase encoding region corresponding to substantially a half of the k-space starting from a central portion of said k-space to an end corresponding to a Nyquist frequency, upon collecting said echo data of the k-space;

a second scan process for effecting scanning from the route scanned in said first scan process with only frequency encoding directions being opposite; and a process for obtaining an image by classifying said echo data of the k-space by the encoding directions of the frequency encoding, reconstructing two images from the separate echo data sets obtained by the classification, and adding absolute number images of the reconstructed images.

According to the invention, there is further provided a magnetic resonance imaging system comprising:

a cylindrical hollow portion for receiving an object to be analyzed;

magnetostatic field generating means provided around said cylindrical hollow portion and generating a highly uniform magnetostatic field to be applied to said object to be analyzed;

gradient field generating mans for making a gradient to said magnetostatic field;

field inverting means for having said gradient field generating means to invert the gradient of said magnetic field;

transmitter means for applying high frequency electromagnetic waves to said object to be analyzed;

receiver means provided in said cylindrical hollow portion and detecting magnetic resonant signals from atomic nuclei in said object to be analyzed due to said high frequency electromagnetic waves and inversion of the gradient of said magnetostatic field;

k-space data developing means for obtaining k-space data by developing echo data detected by said receiver means and converted into a digital form;

data collecting means for collecting data upon collecting the echo data of the k-space by sequentially conducting first scanning of a phase encoding region corresponding to substantially a half the k-space starting from a central portion of said k-space to an end corresponding to a Nyquist frequency and by effecting second scanning the route scanned in said first scan process with an opposite frequency encoding direction; and image forming means for making an image by obtaining an image by classifying said echo data of the k-space by the encoding directions of the frequency encoding, reconstructing two images from the separate echo data sets obtained by the classification, and averaging absolute number images of the reconstructed images.

In these method and system, two kinds of echo data in each phase encoding are obtained in response to scanning types of normal direction and opposite direction, image reconstruction can be performed using each echo data classified by scanning direction at frequency encoding. A known half-reconstruction method can be used for this image reconstruction. Each image is converted into real number by absolute number processing, and is added together for enhancing S/N ratio.

Therefore, according to this method, ghost artifacts derived from polarity inversion of a read-out magnetic gradient can be reduced since absolute number images are made for scanning directions of the frequency encoding and added together so that echo data differences caused by scanning directions are prevented from mixing as a form of phase information of the image.

Since the method and apparatus are configured to reconstruct images by collecting echo data in a half phase encoding region, positional shifts along a phase encoding direction caused by non-uniform static magnetic field are not such that opposite direction shiftings to cause overlapping of the two images, which is the case of centric view ordering. Therefore, the method and system provides another advantage that there is no deterioration in contrast of the image and space resolution.

DETAILED DESCRIPTION OF THE PREFERRED EMBODIMENTS

Embodiments of the invention are explained below with reference to the drawings.

Figure 1:
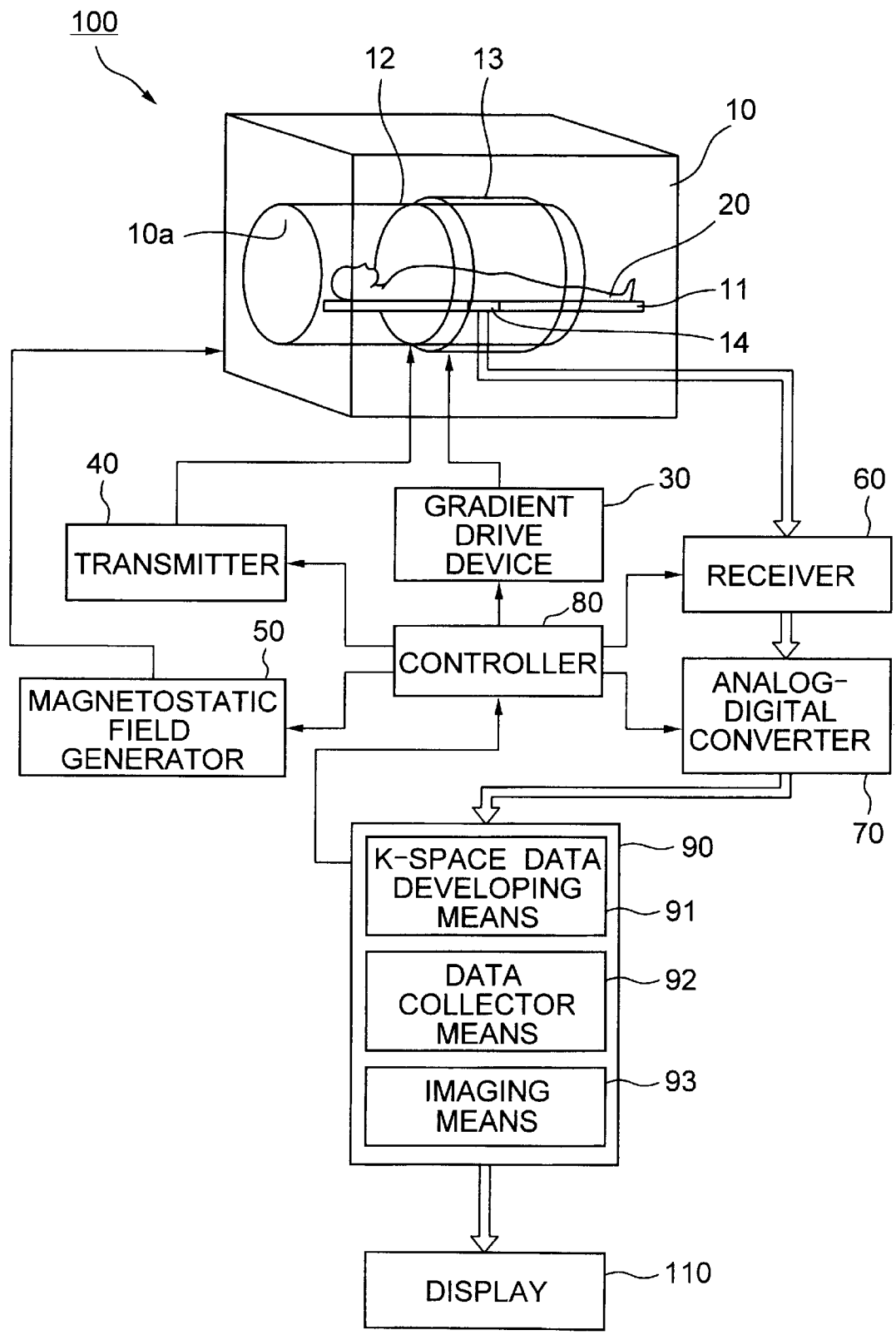
FIG. 1 is a block diagram schematically showing a MRI system 100 according to the invention.

FIG. 1 is a block diagram schematically showing construction of a MRI system 100 according to the invention.

The MRI system 100 is made up of a magnetostatic field generator 10 and various devices 20 through 110 for controlling it.

The magnetostatic field generator 10 has a cylindrical space 10a in its central portion. A superconducting magnet (not shown) driven by a magnetostatic field source 50, for example, encircles the cylindrical space 10a to make an intensive magnetostatic field therein.

Magnetostatic intensity of the superconducting magnet is usually approximately 0.35 to 2.0 T, but higher magnetostatic intensity is employed in FMRI system. Furthermore, there are systems employing a normal-conducting magnet (0.05 to 0.22 T) or permanent magnet.

A bed 11 is slidably mounted in the cylindrical space 10a to support an object to be analyzed 20.

Gradient coils 13 are provided in form of concentric cylinders around the cylindrical space 10a. The gradient coils 13 are driven by gradient drive devices 30 to generate a gradient magnetic field within the magnetostatic field space. The gradient coils 13 used here have a gradient magnetic field intensity of 20 to 40 mT/m and in some systems a rise time to reach the maximum gradient magnetic field reaches 20 µs.

The transmitter coil 12 is driven by a transmitter 40 to generate electromagnetic waves which excite spin in the object to be analyzed. A receiver coil 14 is mounted on the bed in a location around the object to be analyzed to receive electromagnetic waves generated in the object to be analyzed 20 by magnetic resonance, convert them into an analog received signal and deliver it to a receiver 60.

The receiver 60 RF-amplifies the received signal, converts it into an intermediate frequency, then detects it and deliver it to an analog-digital converter 70. The digital signal is input to a computer 90. The analog-digital converter 70 used here should be of a high bandwidth type operative at a high speed so that it can collect data every 1 to 4 µs. Digital values of MR signals measured at different moments of time form an echo data string of a k-space.

The computer 90 reconstructs an image of the object to be analyzed based on the supplied digital signals, and demonstrates the reconstructed result on a display 110. The computer 90 corresponds to a k-space data developing means 91, data collector means 92, and imaging means 93 among various components of the present invention. To process a large amount of transferred data in a short time, here is used a high-speed computer, and a storage device connected to it has a large capacity of several GB. Although the computer 90 is shown here as also controlling the gradient drive device 30, transmitter 40, magnetostatic power source 50, receiver 60 and controller 80 for controlling the analog-digital converter 70, the computer 90 may be configured to also perform the function of the controller 80.

A first embodiment of the magnetic resonance imaging method according to the invention is explained below with reference to FIG. 2 and FIG. 3.

Both the first embodiment and the next-explained second embodiment use non-resonant type EPI, but these embodiments are easily realized in resonant type EPI.

Figure 2:
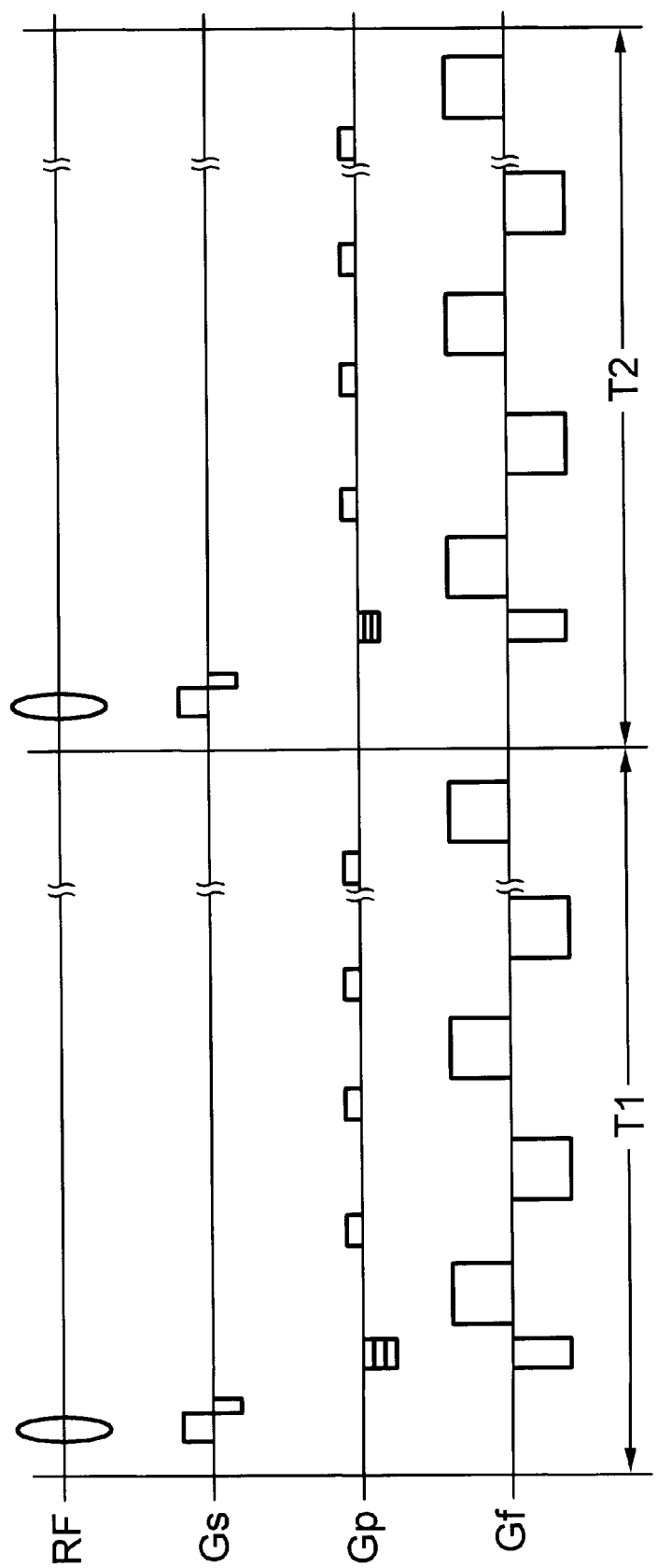
FIG. 2 is a timing chart showing series of pulses used in the first embodiment of the magnetic resonance imaging method according to the invention.

FIG. 2 is a timing chart showing series of pulses used in the first embodiment, and illustrates how phase encoding data packed in a k-space are sequentially collected. In FIG. 2, RF refers to a high-frequency electromagnetic waves applied, Gs to slice gradient, Gp to phase encoding gradient, and Gf to frequency encoding gradient. Here, Gp represents vertical transfers, Gf represents horizontal transfers, and the area of each pulse is proportional to the amount of transfer in k-space,. Each negative pulse in Gp represents an offset explained later, and its area corresponds to the amount of offset. Therefore, between time intervals T1 and T2 of FIG. 2, there is a difference in amount of offset by one phase encoding data.

Figure 3:
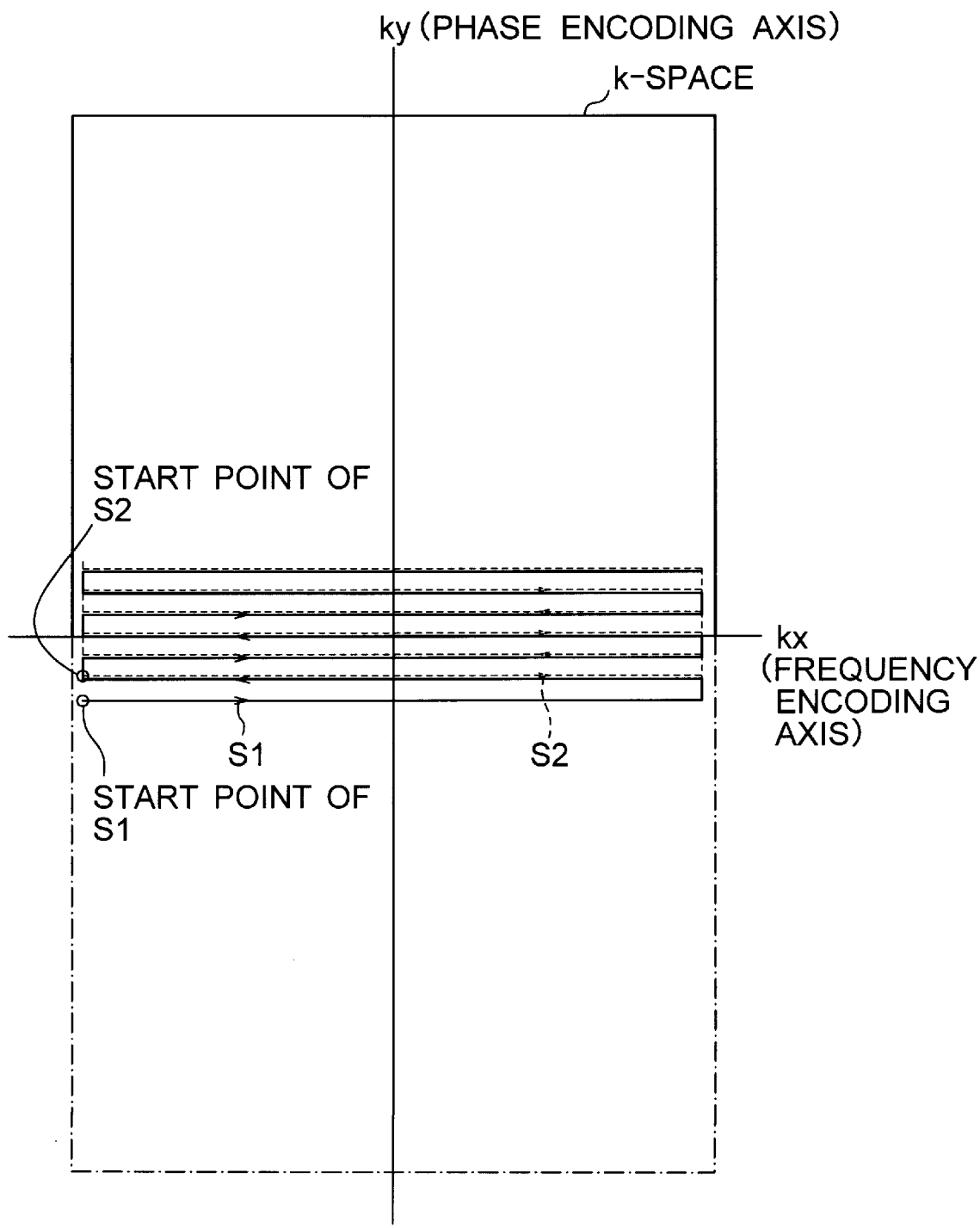
FIG. 3 is a schematic diagram showing how echo data are taken out from a k-space by using the series of pulses shown in FIG. 2.

FIG. 3 shows how echo data fills from the k-space by pulse control. Collection in the interval T1 progresses, as shown in by solid line S1, repeating the motion of first moving rightward from a certain negative-side phase encoding data, then shifting above by one at the right end, going ahead leftward, and again shifting above by one at the left end.

In interval T2, the area of the negative-side pulse of Gp is smaller than that in interval T1 in FIG. 2, the amount of offset is smaller. Therefore, as shown by broken line S2 in FIG. 3, echo data fills the line of one offset above one phase encoding data acquired in interval T1, as a result, in the same phase encoding, echo data can be collected using frequency encoding having opposite scan direction of the echo data acquired in interval T1.

Collection of data mentioned above is usually done on a whole k-space. However, in the present invention, echo data is collected in a half of the k-space for the reason explained below.

First, as explained above, echo data is obtained by switching (inverting) gradient magnetic field in a magnetostatic field at a very high speed. Therefore, among echo data contained in a k-space, adjacent right-going phase encoding data and left-going phase encoding data are different in nature of echo, and the use of them together does not always succeed in obtaining a good image, but is rather liable to produce artifacts.

Taking this into consideration, influences from polarity inversion of a read-out magnetic field gradient can be removed by collecting echo data in double along opposite frequency encoding directions, and reconstructing two separate images on the basis of frequency encoding directions and further adding their absolute number images.

In this case, if all the echo data are doubly collected, imaging time is required for two times. However, according to the present invention, the same imaging time is realized by limiting the echo collection region within a substantially half area in the phase encoding direction which is sufficient for reconstructing images.

Second, data packed in a k-space is a complex data, and an original image, if being a real image, can be reproduced completely with a half data because of a relation of complex conjugate. Therefore, it can be mathematically proved that echo data obtained from a half phase encoding region is sufficient for reproducing the image. Several image reconstructing algorithms based on this theory are known.

Figure 4:
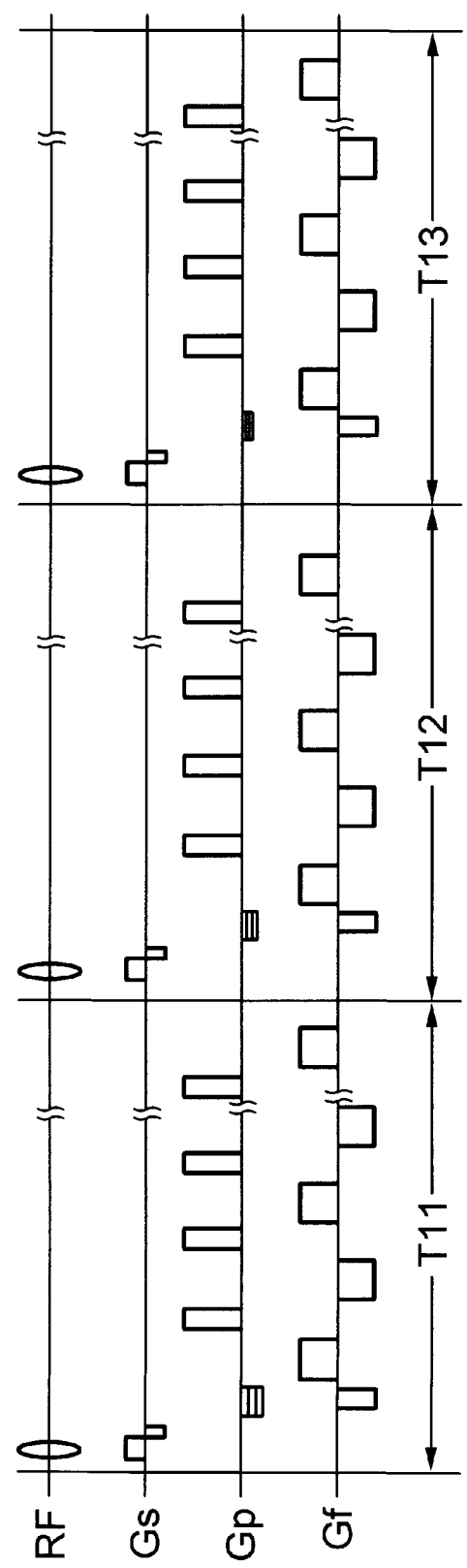
FIG. 4 is a timing chart showing series of pulses used in the second embodiment of the magnetic resonance imaging method according to the invention.

FIG. 4 is a timing chart showing series of pulses used in the second embodiment of the invention, and FIG. 4 is a diagram schematically showing how echo data are filled in a k-space under pulse control.

Figure 5:
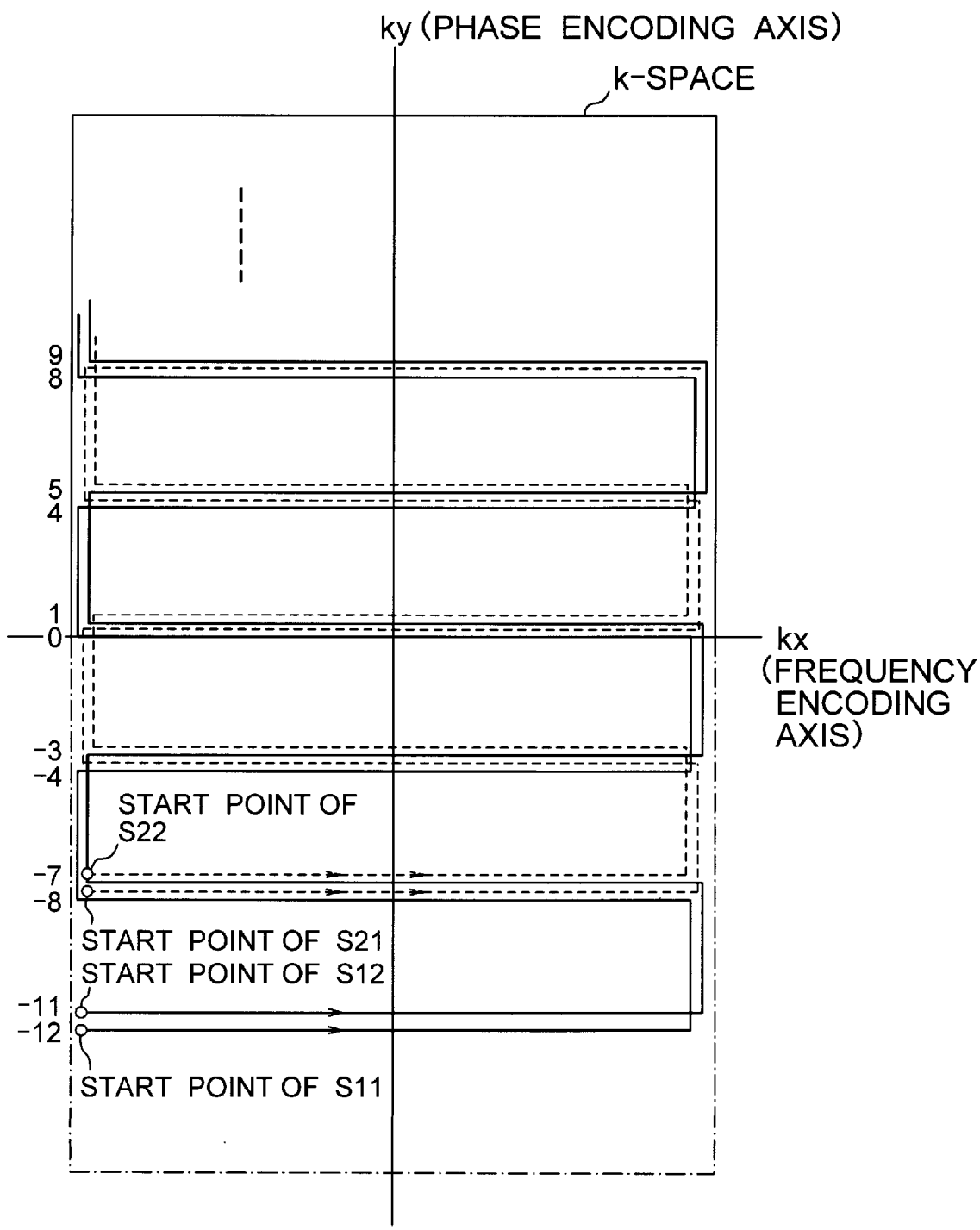
FIG. 5 is a schematic diagram showing how echo data is taken out from a k-space by using the series of pulses shown in FIG. 4.

FIG. 4 is different from FIG. 2 in that the feed stroke of Gp is larger, and the phase encoding data to be collected are discrete. That is, as shown in FIG. 5, the Gp feed stroke is larger than that of FIG. 2. More specifically, the upper pulses of Gp are four times larger them those of FIG. 2 in size, and phase encoding positions for collecting data therefrom are apart more. Therefore, during collection of data, the phase encoding position shifts largely. Considering double data collection, this shifting stroke is every n/2 phase encoding data, if n times of multi-shot should be done. Then, in each cycle of collection, data are collected from phase encoding data of a number corresponding to a value obtained by dividing N by n/2, where N is the number of phase encoding data from the central start point to an end point corresponding to the Nyquist frequency. For example, in the example shown in FIG. 5, since N=72 and n=8, it results in 72/4=16, which means that echo data are extracted from 16 phase encoding data in a single shot.

In intervals T11, T12 and T13, the area of the negative pulse of Gp gradually decreases, and data collection progresses while changing the data collection start position in the k-space from one interval to another.

In the second embodiment, it is the same manner as the first embodiment that echo data for the same phase encoding are collected in double in the opposite direction scannings S11 and S12 start points thereof are shifted for n/2.

FIG. 5 explains such states using reference signs S11, S12, S21 and S22. S21 denotes the first scanning and S12 denotes the second scanning which collects data having phase encoding quantity which is one different from that of S11.

S21 denotes the third scanning which starts from a point shifted for one step initial offset and collects the same phase encoding quantity by scanning along the opposite direction of the scan S11.

S22 is the fourth scanning which collects data having phase encoding quantity which is one different from that of S21 and scans the same encoding quantity as S12.

In the first and second embodiments explained above, the starting phase encoding position of collection of encode data is expanded to the negative side to collect data more than a half of the total phase encoding data of a k-space, namely, to provide a redundancy.

This is because it is effective to know any change of phase caused in image regions in advance and to reconstruct image using phase corrected data in order to obtain a clear image of fat or bloodflow.

In this embodiment, the collection of echo data is performed such that phase encoding proceeds from the center portion of the k-space to the end portion. However, the phase encoding for collecting echo data can proceed from the end portion of the k-space to the central portion Data collected in this manner are processed in an image forming means 93 by classification, Fourier transform, synthesizing,, and so on, to obtain a desired image.

In any of the embodiments, the echo centers of the echo data obtained in each phase encoding do not always coincide for which echos of which shots. This can be prevented, prior to imaging, by collecting echo data with or without phase encoding, as a reference scan, and obtaining the center position. Then, echo data obtained in imaging are compensated using the center position data, which results in images having higher accuracy.

As described above, the magnetic resonance imaging method according to the invention uses echo data of the same phase encoding data collected in opposite frequency encoding directions in a half phase encoding region. The obtained echo data are classified by frequency encoding directions, and used to reconstruction of image. Therefore, the method can prevent an artifact which is an overlapping of images each being offset in phase encoding direction, deterioration of image contrast and space resolution on the case of centric view ordering do not occur, and ghost artifacts caused by polarity inversion of a read-out magnetic field gradient can be reduced. Furthermore, by employing the half reconstruction method, necessary number of echo data to be collected are made half of normal double number of echo data. Therefore, high-speed acquisition of images with less deterioration of S/N in the same imaging time as conventional EPI is realized.

The magnetic resonance imaging system according to the invention, which includes means for realizing the above-mentioned imaging methods, can realize images with less deterioration in image contrast and space resolution and less ghost artifacts in the same imaging time.

What is claimed is:

1. A magnetic resonance imaging method comprising:
  a process for switching (inverting) a gradient magnetic field at a high speed in a magnetostatic field applied to an object to be analyzed and obtaining magnetic resonant signals from atomic nuclei in said object to be analyzed as echo signals necessary for filling a k-space which is constructed by two axes of frequency encoding and phase encoding;
  a process for converting said resonance signals into a digital form and developing them in the k-space as echo data;
  a first scan process for sequentially scanning a phase encoding region corresponding to substantially a half of the k-space starting from a central portion of said k-space to an end corresponding to a Nyquist frequency, upon collecting said echo data of the k-space;
  a second scan process for effecting scanning from the route scanned in said first scan process with only frequency encoding directions being opposite; and a process for obtaining an image by classifying said echo data of the k-space by the encoding directions of the frequency encoding, reconstructing two images from the separate echo data sets obtained by the classification, and adding absolute number images of the reconstructed images.

2. The magnetic resonance imaging method according to claim 1, wherein collection of the echo data in a phase encoding direction is sequentially effected for adjacent phase encodings.

3. The magnetic resonance imaging method according to claim 1 wherein collection of the echo data in phase encoding direction is effected by discretely collecting phase encoding data of a number 2N/n separated by n/2 phase encoding data from a low frequency phase encoding data in a central portion of the k-space to a phase encoding data of the Nyquist frequency, where N is the number of terms from the center to the Nyquist frequency, and n is the number of shots.

4. The magnetic resonance imaging method according to claim 1 wherein collection of the echo data is effected by adding a predetermined number of redundant phase encoding data to the phase encoding data of a half the k-space.

5. A magnetic resonance imaging system comprising:
a cylindrical hollow portion for receiving an object to be analyzed;
magnetostatic field generating means provided around said cylindrical hollow portion and generating a highly uniform magnetostatic field to be applied to said object to be analyzed;
gradient field generating mans for making a gradient to said magnetostatic field;
field inverting means for having said gradient field generating means to invert the gradient of said magnetic field;
transmitter means for applying high frequency electromagnetic waves to said object to be analyzed;
receiver means provided in said cylindrical hollow portion and detecting magnetic resonant signals from atomic nuclei in said object to be analyzed due to said high frequency electromagnetic waves and inversion of the gradient of said magnetostatic field;
k-space data developing means for obtaining k-space data by developing echo data detected by said receiver means and converted into a digital form;
data collecting means for collecting data upon collecting the echo data of the k-space by sequentially conducting first scanning of a phase encoding region corresponding to substantially a half the k-space starting from a central portion of said k-space to an end corresponding to a Nyquist frequency and by effecting second scanning the route scanned in said first scan process with an opposite frequency encoding direction; and
image forming means for making an image by obtaining an image by classifying said echo data of the k-space by the encoding directions of the frequency encoding, reconstructing two images from the separate echo data sets obtained by the classification, and averaging absolute number images of the reconstructed images.

6. The magnetic resonance imaging system according to claim 5, wherein said data collecting means is configured to sequentially collect the echo data in a phase encoding direction for adjacent phase encodings.

7. The magnetic resonance imaging system according to claim 5 wherein collection of the phase encoding data is effected by discretely collecting phase encoding data of a number 2N/n separated by n/2 phase encoding data from a low frequency phase encoding data in a central portion of the k-space to a phase encoding data of the Nyquist frequency, where N is the number of terms from the center to the Nyquist frequency, and n is the number of shots.

8. The magnetic resonance imaging system according to claim 5 wherein collection of the echo data is effected by adding a predetermined number of redundant phase encoding data to the phase encoding data of a half the k-space.

* * * * *